US011598808B2

United States Patent
Spica

(10) Patent No.: US 11,598,808 B2
(45) Date of Patent: **\*Mar. 7, 2023**

(54) CONTROLLER STRUCTURAL TESTING WITH AUTOMATED TEST VECTORS

(71) Applicant: Micron Technology, Inc., Boise, ID (US)

(72) Inventor: Michael Richard Spica, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

This patent is subject to a terminal disclaimer.

(21) Appl. No.: 17/205,490

(22) Filed: Mar. 18, 2021

(65) Prior Publication Data

US 2021/0208199 A1 Jul. 8, 2021

Related U.S. Application Data

(63) Continuation of application No. 16/219,368, filed on Dec. 13, 2018, now Pat. No. 10,976,367.

(51) Int. Cl.
*G01R 31/319* (2006.01)
*G01R 31/3185* (2006.01)
(Continued)

(52) U.S. Cl.
CPC ... *G01R 31/31915* (2013.01); *G01R 31/2834* (2013.01); *G01R 31/318566* (2013.01);
(Continued)

(58) Field of Classification Search
CPC .......... G01R 31/318541; G01R 31/311; G01R 31/31724; G01R 31/318572;
(Continued)

(56) References Cited

U.S. PATENT DOCUMENTS 5,633,813 A 5/1997 Srinivasan
5,751,737 A * 5/1998 Lagrotta ........ G01R 31/318544
714/727
(Continued)

FOREIGN PATENT DOCUMENTS

CN 104078082 10/2014
CN 207586314 7/2018
(Continued)

OTHER PUBLICATIONS

"Chinese Application Serial No. 201980081770.4, Office Action dated Jan. 27, 2022", w English Translation, 9 pgs.
(Continued)

*Primary Examiner* — Cynthia Britt
*Assistant Examiner* — Sazzad Hossain
(74) *Attorney, Agent, or Firm* — Schwegman Lundberg & Woessner, P.A.

(57) ABSTRACT

A system comprises a memory sub-system controller mounted to a printed circuit board (PCB) and an in-circuit test (ICT) device. The memory sub-system controller has test points on the PCB comprising stimulus points and observation points. The ICT device connects to the test points of the controller. The ICT device converts automated test pattern generation (ATPG) input test vectors to test signals. A first set of pin drivers of the ICT device applies the test signals to the stimulus points of the controller and a second set of pin drivers of the ICT device read output signals output at the observation points of the controller. A comparator of the ICT device compares the output signals with output test vectors. The comparator provides test result data comprising a result of the comparison.

20 Claims, 5 Drawing Sheets

(51) Int. Cl.
  *G11C 29/10* (2006.01)
  *G01R 31/28* (2006.01)
  *G11C 29/56* (2006.01)
  *G01R 31/311* (2006.01)
  *G01R 31/317* (2006.01)
(52) U.S. Cl.
  CPC ...... *G01R 31/318572* (2013.01); *G11C 29/10* (2013.01); *G11C 29/56004* (2013.01); *G01R 31/311* (2013.01); *G01R 31/31703* (2013.01); *G01R 31/31724* (2013.01); *G01R 31/318544* (2013.01); *G01R 31/318577* (2013.01)
(58) Field of Classification Search
  CPC ........ G01R 31/318577; G01R 31/2834; G01R 31/31703; G01R 31/318544; G01R 31/31915; G01R 31/318566; G01R 29/56004; G11C 29/10
  See application file for complete search history.

(56) References Cited

U.S. PATENT DOCUMENTS

| | | | |
|---|---|---|---|
| 6,492,923 B1* | 12/2002 | Inoue | H03M 1/1071 714/724 |
| 6,732,304 B1 | 5/2004 | Ong | |
| 6,971,045 B1 | 11/2005 | Deb et al. | |
| 10,976,367 B2* | 4/2021 | Spica | G01R 31/31908 |
| 2004/0107395 A1 | 6/2004 | Volkerink et al. | |
| 2004/0177302 A1 | 9/2004 | Mori et al. | |
| 2005/0097416 A1* | 5/2005 | Plunkett | G01R 31/318547 714/727 |
| 2005/0147211 A1 | 7/2005 | Veeraraghavan | |
| 2006/0139048 A1 | 6/2006 | Walker et al. | |
| 2006/0158208 A1* | 7/2006 | Abboud | G09G 3/006 324/755.01 |
| 2008/0030217 A1* | 2/2008 | Patel | G01R 31/31928 324/762.01 |
| 2010/0262877 A1 | 10/2010 | Narayan et al. | |
| 2012/0087452 A1 | 4/2012 | Zerbe et al. | |
| 2013/0326299 A1 | 12/2013 | Oshima | |
| 2014/0298120 A1 | 10/2014 | Tong | |
| 2015/0067629 A1 | 3/2015 | Wohl et al. | |
| 2015/0276874 A1* | 10/2015 | Morton | G01R 31/318552 714/727 |
| 2015/0287477 A1 | 10/2015 | Tasher et al. | |
| 2016/0091564 A1 | 3/2016 | Li et al. | |
| 2018/0210786 A1 | 7/2018 | Kim | |
| 2020/0191869 A1 | 6/2020 | Spica | |

FOREIGN PATENT DOCUMENTS

| | | |
|---|---|---|
| CN | 113227981 | 8/2021 |
| KR | 20160056588 A | 5/2016 |
| WO | WO-2011059439 A2 | 5/2011 |
| WO | WO-2020123255 A1 | 6/2020 |

OTHER PUBLICATIONS

"International Application Serial No. PCT/US2019/064712, International Search Report dated Apr. 3, 2020", 3 pgs.

"International Application Serial No. PCT/US2019/064712, Written Opinion dated Apr. 3, 2020", 6 pgs.

"International Application Serial No. PCT US2019 064712, International Preliminary Report on Patentability dated Jun. 24, 2021", 8 pgs.

"European Application Serial No. 19897045.1, Response Filed Feb. 2, 2022 to Communication Pursuant to Rules 161(2) and 162 EPC dated Jul. 23, 2021", 14 pgs.

"Chinese Application Serial No. 201980081770.4, Response filed Jun. 10, 2022 to Office Action dated Jan. 27, 2022", w/ English claims, 22 pgs.

"European Application Serial No. 19897045.1, Extended European Search Report dated Aug. 9, 2022", 9 pgs.

* cited by examiner

CONTROLLER STRUCTURAL TESTING WITH AUTOMATED TEST VECTORS

PRIORITY APPLICATION

This application is a continuation of U.S. application Ser. No. 16/219,368, filed Dec. 13, 2018, which is incorporated herein by reference in its entirety.

TECHNICAL FIELD

Embodiments of the disclosure relate generally to memory sub-systems and, more specifically, to structural testing of memory sub-system controllers with automated test vectors.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
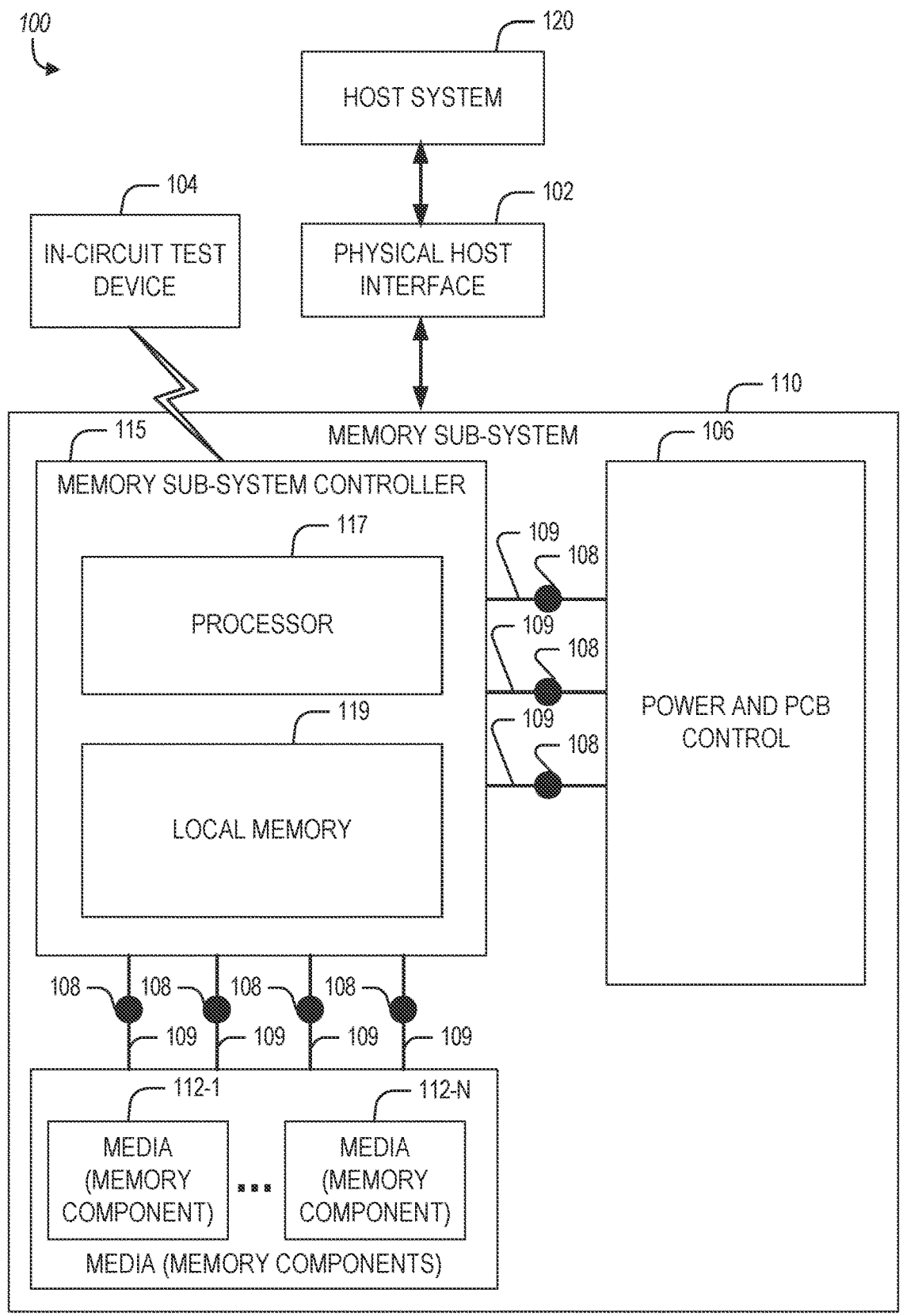
FIG. 1 illustrates an example computing environment that includes a memory sub-system, in accordance with some embodiments of the present disclosure.

Aspects of the present disclosure are directed to structural testing of a controller in a memory sub-system using automated test vectors. A memory sub-system is also hereinafter referred to as a "memory device." An example of a memory sub-system is a storage system, such as a SSD. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. A memory sub-system controller (referred to hereinafter simply as a "controller") can receive commands or operations from the host system and can convert the commands or operations into instructions or appropriate commands to achieve the desired access to the memory components.

Manufacturing testing is performed on memory sub-systems to ensure that all components are assembled correctly and function as expected. Testing of controllers at the silicon level utilizes a methodology that relies upon automated test pattern generation (ATPG) (also referred to as "scan-based testing"). ATPG involves developing a unique set of inputs, referred to as "test vectors," to test the structure of a controller. ATPG vectors are typically created and supplied by a controller manufacturer.

At the printed circuit board assembly (PCBA) level, controller functionality is tested using firmware executing on the controller. This firmware is generally developed independent from ATPG test vectors, and thus requires potentially redundant manual development to test the proper functioning of the controller that requires detailed knowledge of the internal architecture and register execution of the controller to provide adequate test coverage. Further, since the controller executes the firmware that is used to test the controller there is an inherent loss in test coverage in this process. Moreover, the execution time of firmware based operations is typically 1-2 orders of magnitude higher than pure hardware operations, which drives up manufacturing costs. In addition, the non-recurring engineering (NRE) of developing the firmware is an additional expense that increases manufacturing cost.

Aspects of the present disclosure address the above and other deficiencies of conventional PCBA level controller testing by having an in-circuit test (ICT) device and memory sub-system controller configured to allow reuse of ATPG test vectors during PCBA level testing. The ICT test device includes a test signal generator that generates test signals based on the ATPG test vectors and pin drivers of the ICT test device apply the test signals to the memory sub-system controller and read output signals provided by the memory sub-system controller in response to the test signals. The memory sub-system controller is configured to include dual-purpose test pins to allow the reusing of the ATPG test vectors. In particular, scan pins of the memory sub-system controller, typically used for performing boundary scan-based testing, are adapted to have a path placement on the printed circuit board (PCB) to provide access to the ICT device to facilitate testing. The ICT device connects to the test pins of the memory sub-system via the path placement on the PCB and is capable of performing testing of the memory sub-system controller using ATPG vectors to achieve full controller coverage and allow for consistent coverage application for all steps.

It shall be appreciated that the approach described above provides an improvement over conventional PCBA level testing of memory sub-system controllers in that it allows reuse of ATPG test vectors at the PCBA level thereby reducing potential redundant efforts made in developing test coverage via firmware implementation with system constraints. Such vector reuse also improves upon conventional PCBA level testing by providing determined fault coverage evaluation. What's more, by reusing the ATPG test vectors, this approach lowers the cost of execution in test time.

FIG. 1 illustrates an example computing environment 100 that includes a memory sub-system 110, in accordance with some embodiments of the present disclosure. The memory sub-system 110 can include media, such as memory components 112-1 to 112-N. The memory components 112-1 to 112-N can be volatile memory components, non-volatile memory components, or a combination of such. In some embodiments, the memory sub-system 110 is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface 102. As used herein. "coupled to" generally refers to a connection between components, which can be an indirect communicative connection or direct communicative connection (e.g., without intervening components), whether wired or wireless, including connections such as electrical, optical, magnetic, and the like. Examples of a physical host interface 102 include, but are not limited to, a serial advanced technology attachment (SATA) interface, a peripheral component interconnect express (PCIe) interface, universal serial bus (USB) interface, Fibre Channel, Serial Attached SCSI (SAS), and so forth. The physical host interface 102 can be used to transmit data between the host system 120 and the memory sub-system 110. The host system 120 can further utilize a Non-Volatile Memory (NVM) Express (NVMe) interface to access the memory components 112-1 to 112-N when the memory sub-system 110 is coupled with the host system 120 by the PCIe interface. The physical host interface 102 can provide an interface for passing control, address, data, and other signals between the memory sub-system 110 and the host system 120.

The memory components 112-1 to 112-N can include any combination of the different types of non-volatile memory components and/or volatile memory components. An example of non-volatile memory components includes a negative-and (NAND) type flash memory. Each of the memory components 112-1 to 112-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112-1 to 112-N can be based on any other type of memory such as a volatile memory. In some embodiments, the memory components 112-1 to 112-N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, as noted above, the memory cells of the memory components 112-1 to 112-N can be grouped into memory slots that can refer to a common fixed sized unit of the memory component for allocation to a requestor and to be used to store data.

The memory sub-system controller 115 (hereinafter referred to as "controller") can communicate with the memory components 112-1 to 112-N to perform operations such as reading data, writing data, or erasing data at the memory components 112-1 to 112-N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and the like. The local memory 119 can also include ROM for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system 110).

In general, the controller 115 can receive commands or operations from the host system 120 and can convert the commands or operations into instructions or appropriate commands to achieve the desired access to the memory components 112-1 to 112-N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112-1 to 112-N. The controller 115 can further include host interface circuitry to communicate with the host system 120 via the physical host interface 102. The host interface circuitry can convert the commands received from the host system 120 into command instructions to access the memory components 112-1 to 112-N as well as convert responses associated with the memory components 112-1 to 112-N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112-1 to 112-N.

The example computing environment 100 further includes an in-circuit test (ICT) device 104 coupled to the controller 115. The ICT device 104 is configured to perform testing on the controller 115 to ensure the controller 115 functions as expected. In particular, the ICT device 104 is specially configured to utilize Automated Test Pattern Generation (ATPG) test vectors, which are conventionally used only in testing at the silicon level, in performing printed board assembly (PCBA) testing of the controller 115. Thus, in the context of FIG. 1, the controller 115 and the other components of the memory sub-system 110 are mounted to a printed circuit board (PCB). Accordingly, a power and PCB control component 106 is included in the example computing environment 100 to provide power and other control signals to the components of the memory sub-system 110 mounted on the PCB.

The ICT device 104 may communicate with the controller 115 for testing purposes via contacts to one or more test points of the controller 115 exposed on the PCB. For example, as shown on FIG. 1, multiple test points 108 are provided on the PCB for the controller 115. The test points 108 include a set of stimulus points and a set of observation points. The ICT device 104 applies test signals generated based on ATPG test vectors to the set of stimulus points and reads output signals that are output at the set of observation points in response to the test signals.

The test points 108 of the controller 115 are placed on test pins 109 of the controller 115. The test pins 109 of the controller 115 are traditionally referred to as "boundary scan pins" or simply as "scan pins" because these test pins 109 traditionally facilitate testing of the controller 115 using Boundary Scan Description Language (BSDL) based test vectors. With the addition of the test points 108, the scan pins of the controller 115 are given a dual-purpose configuration in that they are configured to facilitate testing of the controller 115 using both BSDL and ATPG based test vectors. The scan pins of the controller 115 that are configured as the dual-purpose test pins 109 may, for example, include scan-in, scan-out, scan enable, scan clock, scan reset, and scan control pins. At least a portion of the stimulus points may correspond to scan-in pins of the controller 115 exposed on the PCB and at least a portion of the observation points may correspond to scan-out pins of the controller 115 exposed on the PCB.

With reference to this dual-purpose configuration of test pins 109, at least some of the test pins 109 of the controller 115 may be configured to include an in-series resistor to mitigate contention that might otherwise be caused by driving the test pins 109 of the controller 115 with test signals derived from the ATPG test vectors given that other components may also be connected to the net being driven. A portion of the test pins 109 may also include an additional test point 108 such that the test pin 109 includes a test point 108 on either side of the resistor (not illustrated in FIG. 1). Test points 108 on test pins 109 that are designated as "no connect" pins are not configured to include a contention mitigating resistor since no contention will occur given that no other components will be connected to the pin.

Figure 2:
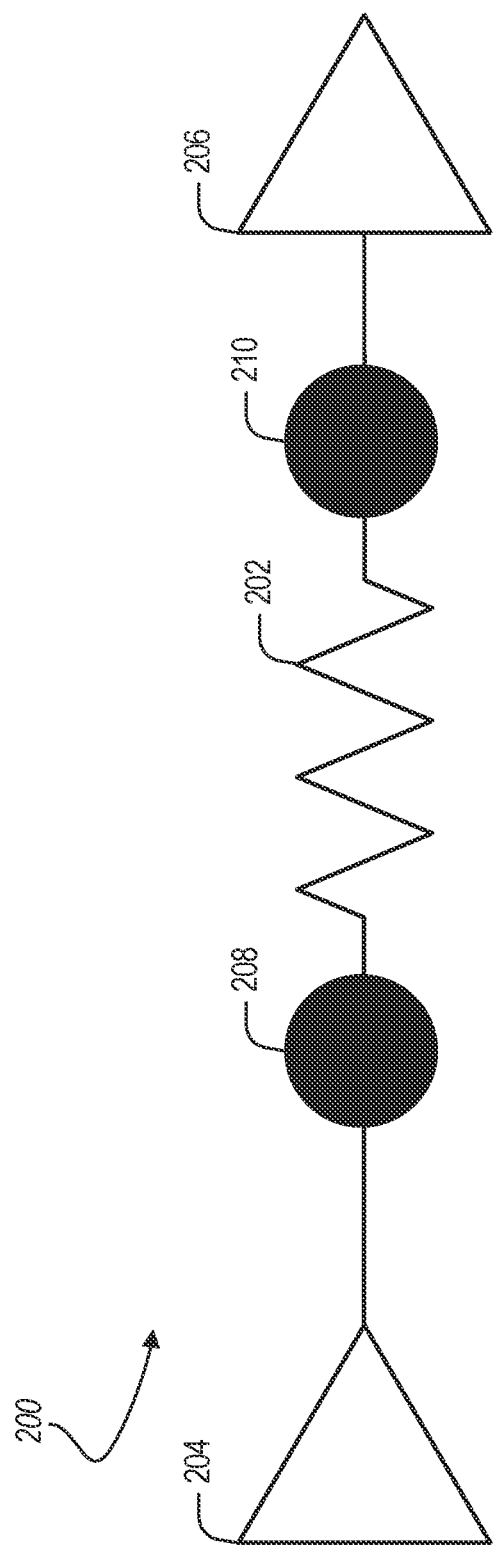
FIG. 2 is a block diagram illustrating a dual-purpose pin configuration for a memory sub-system controller, in accordance with some embodiments of the present disclosure.

As an example of the forgoing, FIG. 2 illustrates a dual-purpose configuration for a test pin 200 for the memory sub-system controller 115, in accordance with some embodiments of the present disclosure. The test pin 200 is an example of one of the test pins 109 illustrated in FIG. 1. As shown, the test pin 200 comprises a resistor 202 connected in series between a driver 204 and a buffer 206. A test point 208 is placed between the driver 204 and the resistor 202 and a test point 210 is placed between the resistor 202 and the buffer 206. The test points 208 and 210 are examples of the test points 108 illustrated in FIG. 1. In this manner, the resistor 202 eliminates or at least mitigates contention on downstream components that may otherwise be caused by driving a test point on the test pin 200.

Although FIG. 2 illustrates the test pin 200 as including both test points 208 and 210, in some instances, the test pin 200 may include only a single one of the test points 208 or 210. Further, in instances which the test pin 200 is designated as a "no connect" pin, only a single one of the test points 208 or 210 is included and the resistor 202 is omitted.

Figure 3:
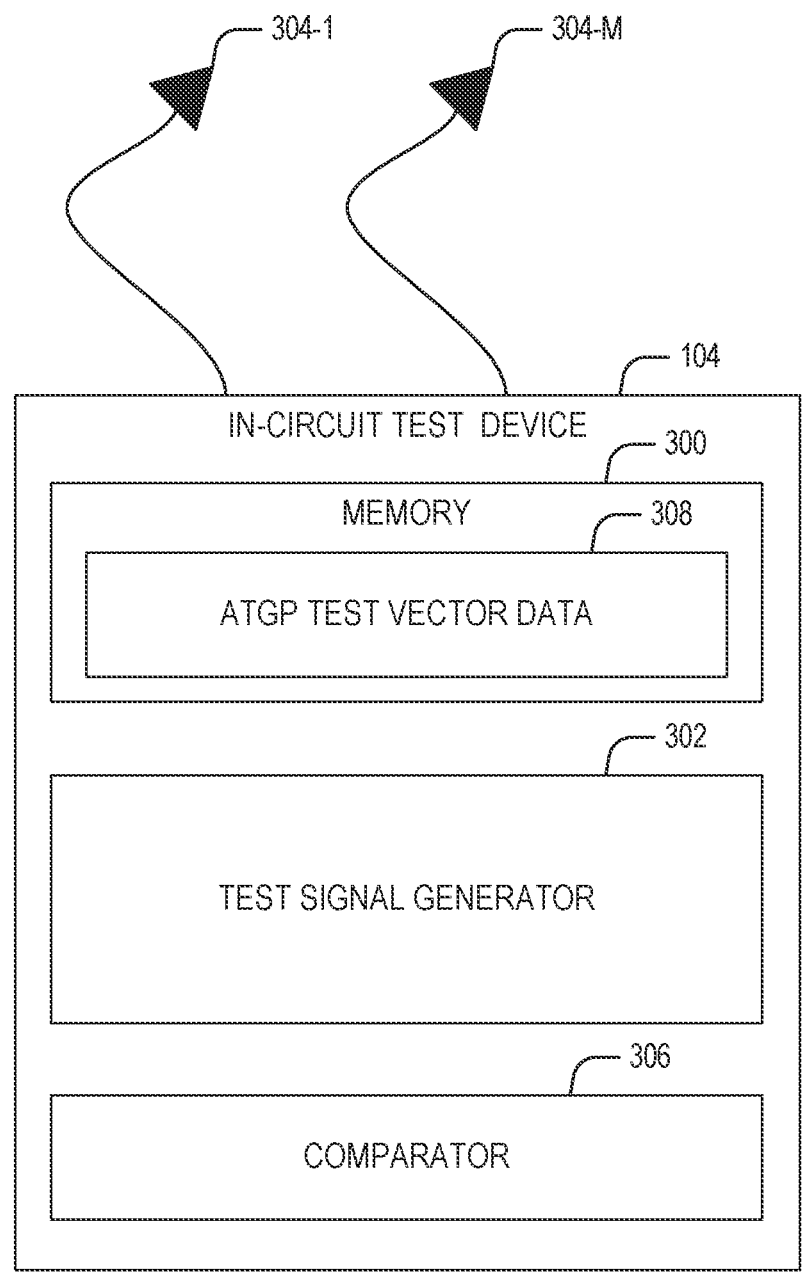
FIG. 3 is block diagram illustrating components of an in-circuit test device (ICT), in accordance with some embodiments of the present disclosure.

FIG. 3 is block diagram illustrating components of the ICT device 104, in accordance with some embodiments of the present disclosure. The ICT device 104 comprises a memory 300, a test signal generator 302, pin drivers 304-1 to 304-M, and comparator 306. To avoid obscuring the inventive subject matter with unnecessary detail, various functional components that are not germane to conveying an understanding of the inventive subject matter have been omitted from FIG. 3. However, a skilled artisan will readily recognize that various additional functional components may be supported by the ICT device 104 to facilitate additional functionality that is not specifically described herein.

The memory 300 stores ATPG test vector data 308. The ATPG test vector data 308 comprises input and output of ATPG test vectors. The input of ATPG test vectors comprise input test sequences (e.g., a binary sequence) to be applied to the controller 115 for testing purposes. The output ATPG test vectors comprise an expected output resulting from applying the input ATPG test vectors to the controller 115. The ATPG test vector data 308 may include or otherwise be extracted from a standard test interface language (STIL) file, which may be provided by a manufacturer of the controller 115.

The test signal generator 302 generates test signals based on the ATPG test vector data. 308 The test signals generated by the test signal generator 302 are electrical signals representative of the input ATPG test vectors that are suitable for driving the test points 108 of the controller 115 on the PCB. The test signal generator 302 may be implemented using processing logic that can include hardware (e.g., processing device, circuitry, dedicated logic, programmable logic, microcode, hardware of a device, integrated circuit, etc.), software (e.g., instructions run or executed on a processing device), or a combination thereof. For example, test signal generator 302 may include a set of instructions (e.g., software stored in a memory 300) that configures a processing device (e.g., a processor of ICT device 104) to generate the electrical signals.

The pin drivers 304-1 to 304-M connect to test points 108 of the controller 115 on the PCB. More specifically, the pin drivers 304-1 to 304-M connect to test points 108 on scan-pins 109 of the controller 115 exposed on the PCB. As noted above, consistent with some embodiments, the pin drivers 304-1 to 304-M may connect to test points 108 on scan-in, scan-out, scan enable, scan clock, scan reset, and scan control pins of the controller 115 exposed on the PCB. A first set of the pin drivers 304-1 to 304-M applies the test signals to the test points 108 of controller 115 on the PCB. That is, the first set of the pin drivers 304-1 to 304-M uses the test signals to drive stimulus points of the controller 115 on the PCB. As an example, a first pin driver 304-1 may drive a stimulus point on a scan-in pin of the controller 115 exposed on the PCB.

A second set of the pin drivers 304-1 to 304-M reads output signals output at test points 108 of the controller 115 on the PCB. The output signals are output by the controller 115 as a result of applying the test signals to the controller 115. As an example, a second set of pin drivers 304-1 to 304-M may read an output signal output at an observation point on a scan-out pin of the controller 115 exposed on the PCB.

The comparator 306 compares the output signals from the controller 115 with the output ATPG test vectors stored in the memory 300. That is, the comparator 306 compares the output signals output by the controller 115 that result from applying the test signals to the controller 115 with an expected result of applying the test signals to the controller 115. The comparator 306 provides test result data indicative of a result of comparing the output signals with the output ATPG test vectors. In essence, the test result data indicates a positive or a negative test result. A positive test result occurs when an output signal matches the expected result represented by the corresponding output test vector. A negative test result occurs when an output signal does not match the expected result represented by the corresponding output test vector. The test result data may include an indication for each test signal or may include an indication of an overall result of applying all test signals to the controller 115.

Figure 4:
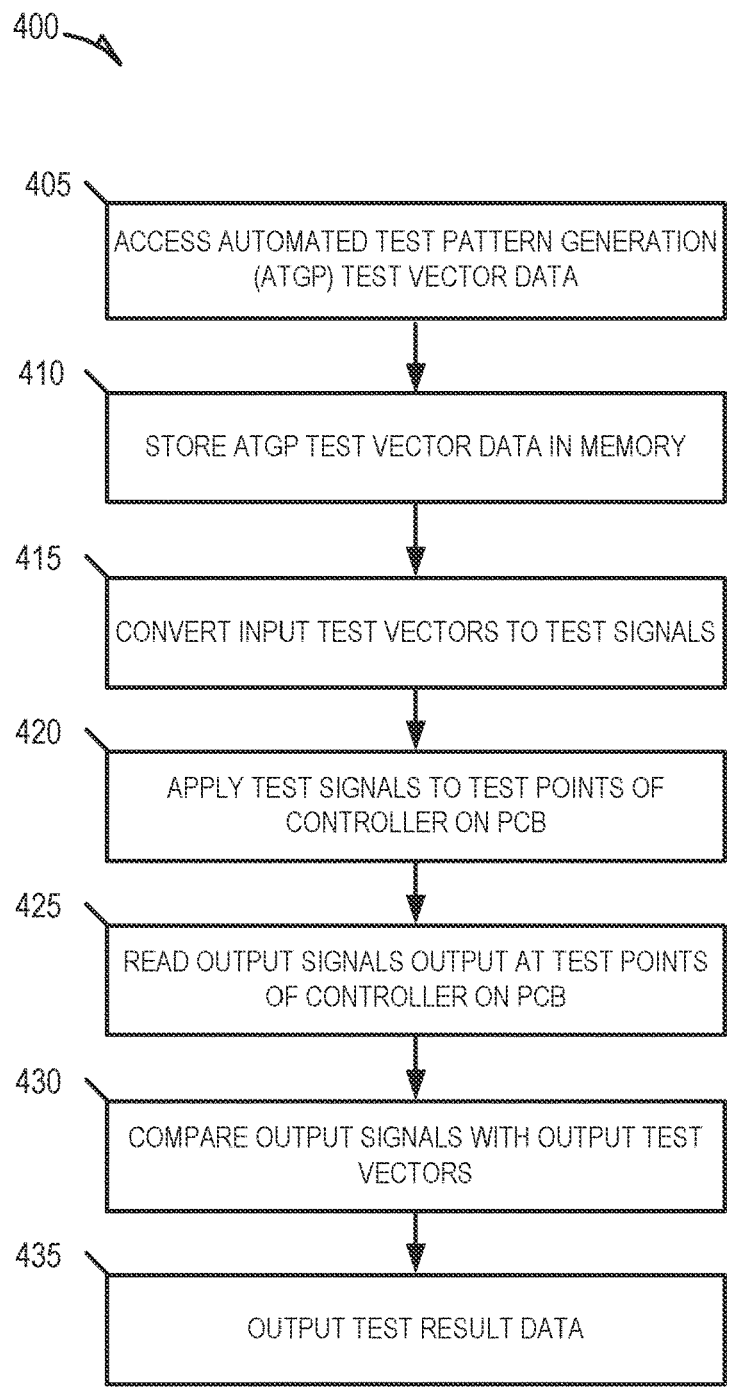
FIG. 4 is a flow diagram of an example method to perform testing of a memory sub-system controller mounted on a printed circuit board (PCB), in accordance with some embodiments of the present disclosure.

FIG. 4 is a flow diagram of an example method 400 to perform testing of a memory sub-system controller 115 mounted on a PCB, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the in-circuit testing device 104 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device accesses ATPG test vector data (e.g., ATPG test vector data 308). The ATPG test vector data includes ATPG input and output test vectors. Each input test vector comprises an input sequence to be applied to the controller 115 and each output test vector comprises an expected result of applying a corresponding input test vector to the controller 115. The ATPG test vector data 308 may correspond to a STIL file.

At operation 410, the processing device stores the ATPG test vector data 308 in an embedded memory 300 unit. In embodiments in which the in-circuit test device 104 is the processing device, the in-circuit test device 104 stores the ATPG test vector data 308 in the memory 300.

At operation 415, the processing device converts the input test vectors to test signals. For example, the processing device may convert the input test vectors to electrical signals suitable to drive test points 108 of the controller 115 on the PCB. In embodiments in which the ICT device 104 is the processing device, the test signal generator 302 generates the test signals.

At operation 420, the processing device applies the test signals to the controller 115. More specifically, the processing device uses the test signals to drive test points 108 of the controller 115 on the PCB. In embodiments in which the processing device is the in-circuit test device 104, a first set of pin drivers 304-1 to 304-M of the in-circuit test device 104 drive the stimulus points of the controller 115 on the PCB.

At operation 425, the processing device reads output signals output by the controller 115 as a result of applying the test signals to the controller 115. More specifically, the processing device reads output signals output at test points 108 of the controller 115 on the PCB. In embodiments in which the processing device is the ICT device 104, a second set of pin drivers 304-1 to 304-M of the ICT device 104 read output signals output at observation points of the controller 115 on the PCB.

At operation 430, the processing device compares the output signals with the output test vectors stored in the memory unit 300 of the processing device. That is, the processing device compares the output signals output by the controller 115 in that result from applying the test signals to the controller 115 with an expected result of applying the test signals to the controller 115. In embodiments in which the processing device is the ICT device 104, the comparator 306 of the ICT device 104 compares the output signals with the output test vectors stored in the memory 300.

At operation 435, the processing device outputs test result data comprising an indication of the result of the comparison of the output signals with the output test vectors. For example, if an output signal matches corresponding output test vectors (e.g., the output test vector corresponding to the particular test signal applied the controller 115), the processing device provides test result data that includes an indication of a positive test result, but if the output signal does not match the output test vector, the processing device provides test result data that includes an indication of a negative test result. The test result data may include such an indication for each test signal or may include an indication of an overall result of applying all test signals to the controller 115.

Figure 5:
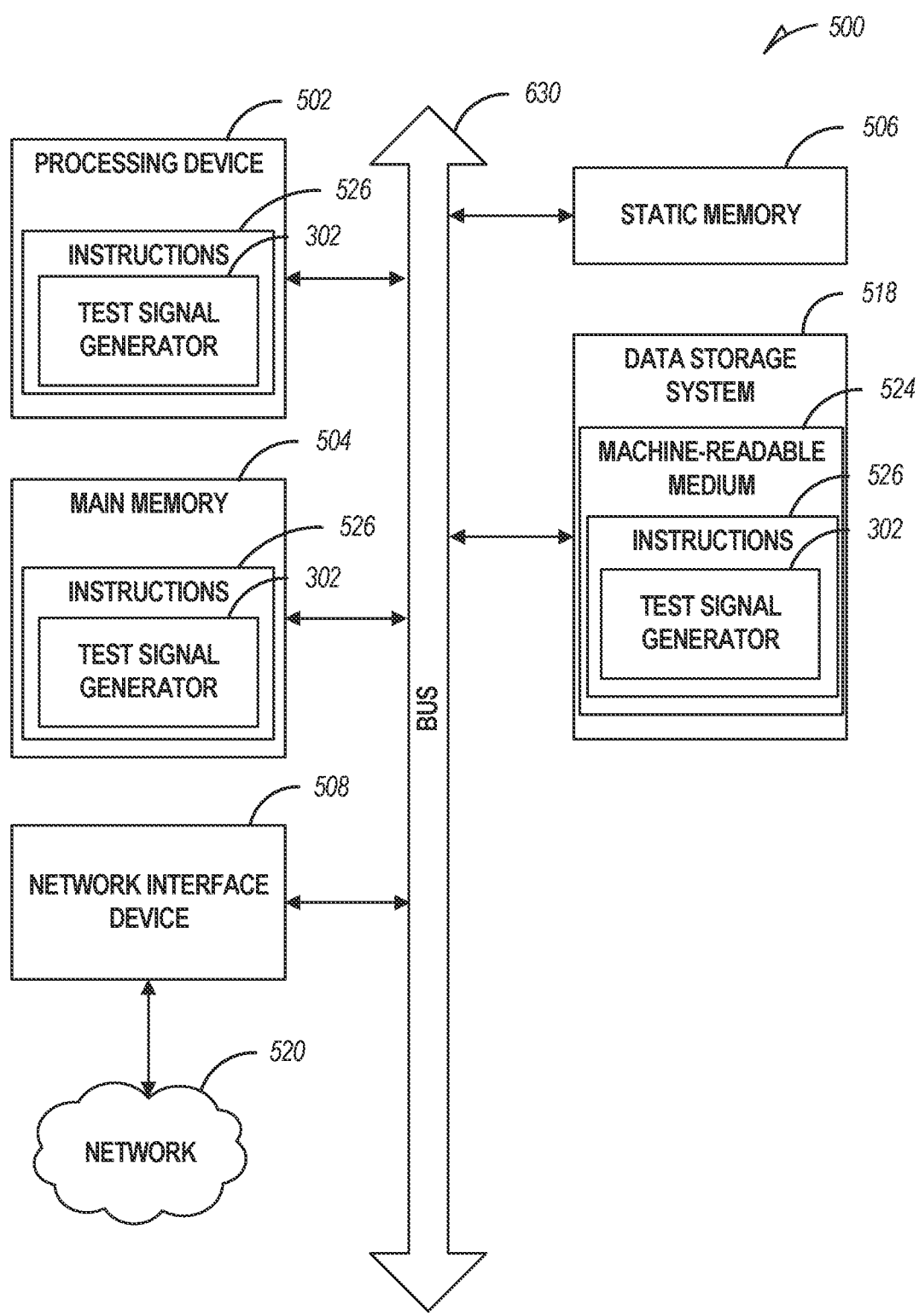
FIG. 5 is a block diagram of an example computer system in which embodiments of the present disclosure may operate

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., the controller 115) or the ICT device 104 (e.g., to perform operations corresponding to signal generator 302). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., ROM, flash memory, DRAM such as SDRAM or Rambus DRAM (RDRAM), etc.), a static memory 506 (e.g., flash memory, static random access memory (SRAM), etc.), and a data storage system 518, which communicate with each other via a bus 630.

Processing device 502 represents one or more general-purpose processing devices such as a microprocessor, a central processing unit, or the like. More particularly, the processing device 502 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an ASIC, a FPGA, a digital signal processor (DSP), network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media 524. The machine-readable storage medium 524, data storage system 518, and/or main memory 504 can correspond to the memory sub-system 110 of FIG. 1 or the memory 300 of the ICT device 104.

In one embodiment, the instructions 526 include instructions to implement functionality corresponding to an ICT device 104 (e.g., the functionality of the test signal generator 302). While the machine-readable storage medium 524 is shown in an example embodiment to be a single medium, the term "machine-readable storage medium" should be taken to include a single medium or multiple media that store the one or more sets of instructions 526. The term "machine-readable storage medium" shall also be taken to include any medium that is capable of storing or encoding a set of instructions 526 for execution by the machine 500 and that cause the machine 500 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. The present disclosure can refer to the action and processes of a computer system 500, or similar electronic computing device, that manipulates and transforms data represented as physical (electronic) quantities within the computer system 500's registers and memories into other data similarly represented as physical quantities within the computer system 500 memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs. EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

EXAMPLES

Example 1 is a system comprising: a memory sub-system controller mounted to a printed circuit board, the memory sub-system controller having a plurality of test points on the printed circuit board, the plurality of test points comprising a set of stimulus points and a set of observation points; and an in-circuit test device connected to the plurality of test points of the memory sub-system controller on printed circuit board, the in-circuit test device comprising: a memory storing a set of machine-readable instructions that cause the in-circuit test device to convert automated test pattern generation (ATPG) input test vectors to test signals; a first set of pin drivers to apply the test signals to the set of stimulus points of the memory sub-system controller; a second set of pin drivers to read output signals output at the set of observation points of the memory sub-system controller; and a comparator to compare the output signals with output test vectors, the output test vectors comprising an expected result of applying the test signals to the memory sub-system controller, the comparator further to provide test result data comprising a result of comparing the output signals to the output test vectors.

In Example 2, the in-circuit test device of Example 1 optionally further comprises a second memory to store ATPG test vector data, the ATPG vector data comprising the ATPG input test vectors and the output test vectors.

In Example 3, the ATPG test vector data of any of Examples 1 and 2 optionally comprises a standard test interface language (STIL) file.

In Example 4, at least one test point of any of Examples 1-3 optionally corresponds to a test pin of the memory sub-system controller on the printed circuit board, the test pin comprising a resistor connected in series between a driver and a buffer.

In Example 5, the subject matter of any of Examples 1-4 optionally comprises a first test point placed between a driver and a resistor of a test pin.

In Example 6, the subject matter of any of Examples 1-5 optionally comprises second test point placed between a resistor and a buffer of a test pin.

In Example 7, the subject matter of any of Examples 1-6 optionally comprises a test point corresponding to a test pin designated as a no connect pin, the test pin comprises a driver connected in series with a buffer, and the test point is placed between the driver and the buffer.

In Example 8, at least one of the set of stimulus points of any one of Examples 1-7 optionally corresponds to a scan-in pin of the memory sub-system controller and at least one of the set of observation points of any one of Examples 1-7 optionally corresponds to a scan-out pin of the memory sub-system controller.

Example 9 is an in-circuit test device comprising: a memory storing a set of machine-readable instructions that cause the in-circuit test device to convert automated test pattern generation (ATPG) input test vectors to test signals; a plurality of pin drivers to connect to a plurality of test points of a memory sub-system controller on a printed circuit board, at least one of the plurality of pin drivers to apply the test signals to the memory sub-system controller, at least one of the plurality of pin drivers to read output data output by the memory-subsystem controller in response to the test signals; and a comparator to compare the output signals with output test vectors, the output test vectors comprising an expected result of applying the test signals to the memory sub-system controller, the comparator further to provide test result data comprising a result of comparing the output signals to the output test vectors.

In Example 10, the plurality of test points of Example 9 optionally comprises a set of stimulus points and a set of observation points.

In Example 11, the subject matter of any of Examples 9 and 10 optionally comprises a first set of pin drivers to apply test signals to a set of stimulus points, the output signals are output at a set of observation points, and a second set of pin drivers to read the output signals output at the set of observation points.

In Example 12, at least one test point of any of Examples 9-11 optionally corresponds to a test pin of the memory sub-system controller on the printed circuit board, the test pin comprising a resistor connected in series between a driver and a buffer.

In Example 13, the subject matter of any one of Examples 9-12 optionally comprises a test point placed between a driver and a resistor of a test pin.

In Example 14, the subject matter of any one of Examples 9-13 optionally comprises a test point placed between a resistor and a buffer of a test pin.

In Example 15, at least one of the set of stimulus points of any one of Examples 9-14 optionally corresponds to a scan-in pin of the memory sub-system controller and at least one of the set of observation points of any one of Examples 9-14 optionally corresponds to a scan-out pin of the memory sub-system controller.

In Example 16, the subject matter of any one of Examples 9-15 optionally comprises a second memory to store ATPG test vector data, the ATPG test vector data comprising input test vectors and output test vectors.

In Example 17, the ATPG test vector data of any one of Examples 9-16 optionally comprises a STIL file.

Example 18 is a method comprising: accessing, at an in-circuit test device, automated test pattern generation (ATPG) test vector data, the ATPG test vector data comprising input test vectors and output test vectors, the output test vectors comprising an expected result of applying the input test vectors to a memory sub-system controller; converting the input test vectors to test signals; applying the test signals to a first set of test points of the memory sub-system controller on a printed circuit board; reading output signals output at a second set of test points of the memory sub-system controller on the printed circuit board; comparing the output signals with the output test vectors; and providing test result data comprising a result of comparing the output signals with the output test vectors.

In Example 19, the subject matter of Example 18 optionally comprises applying a test signal to a first test point corresponding to a scan-in pin of the memory sub-system controller, the scan-in pin comprising a resistor connected in series between a driver and a buffer.

In Example 20, the subject matter of any one of Examples 18 and 19 optionally comprises reading an output signal output at a second test point corresponding to a scan-out pin of the memory sub-system controller.

Example 21 is a memory sub-system controller mounted to a printed circuit board, the memory sub-system controller comprising: a plurality of test points on the printed circuit board, the plurality of test points comprising a set of stimulus points and a set of observation points.

In Example 22, the subject matter of Example 21 optionally comprises at least one test point corresponding to a test pin of the memory sub-system controller on the printed circuit board, the test pin comprising a resistor connected in series between a driver and a buffer.

In Example 23, the subject matter of any one of Examples 21 and 22 optionally comprises a first test point placed between the driver and the resistor.

In Example 24, the subject matter of any one of Examples 21-23 optionally comprises a second test point placed between the resistor and the buffer.

In Example 25, the subject matter of any one of Examples 21-24 optionally comprises: a test point of the plurality of test points corresponding to a test pin designated as a no connect pin, the test pin comprises a driver connected in series with a buffer, and a test point is placed between the driver and the buffer.

In Example 26, the subject matter of any one of Examples 21-25 optionally comprises at least one of the set of stimulus points that corresponds to a scan-in pin of the memory sub-system; and at least one of the set of observation points that corresponds to a scan-out pin of the memory sub-system.

What is claimed is:

1. A system comprising:
a memory sub-system controller mounted to a printed circuit board, the memory sub-system controller having a plurality of test points on the printed circuit board, the plurality of test points comprising a stimulus point corresponding to a scan-in pin of the memory sub-system controller exposed on the printed circuit board, the scan-in pin configured to facilitate testing of the memory sub-system controller using Boundary Scan Description Language (BSDL) test vectors; and
an in-circuit test device connected to the plurality of test points of the memory sub-system controller on the printed circuit board, the in-circuit test device comprising:
a processing device executing instructions that cause the processing device to convert automated test pattern generation input test vectors from a standard test interface language (STIL) file to a set of test signals, the set of test signals including a test signal that is capable of driving the scan-in pin configured to facilitate testing of the memory sub-system controller using BSDL test vectors; and
a pin driver to apply the test signal generated based on the STIL file to the scan-in pin of the memory sub-system controller exposed on the printed circuit board.

2. The system of claim 1, wherein:
the plurality of test points comprise a set of stimulus points and a set of observation points;
the set of stimulus points including the stimulus point corresponding to the scan-in pin of the memory sub-system controller; and
an observation point in the set of observation points corresponds to a scan-out pin of the memory sub-system controller exposed on the printed circuit board.

3. The system of claim 2, wherein the in-circuit test device further comprises:
a first set of pin drivers to apply the test signals to the set of stimulus points of the memory sub-system controller, the first set of pin drivers including the pin driver; and
a second set of pin drivers to read output signals output at the set of observation points of the memory sub-system controller.

4. The system of claim 3, wherein the in-circuit test device further comprises:
a comparator to compare the output signals with output test vectors, the output test vectors comprising an expected result of applying the test signals to the memory sub-system controller, the comparator further to provide test result data comprising a result of comparing the output signals to the output test vectors.

5. The system of claim 1, wherein the in-circuit test device further comprises:
a memory storing automated test pattern generation test vector data comprising the STIL file, the STIL file including the automated test pattern generation input test vectors.

6. The system of claim 5, wherein:
the automated test pattern generation vector data further comprises output test vectors.

7. The system of claim 1, wherein converting the automated test pattern generation input test vectors from the STIL file to test signals comprises generating electrical signals representative of the automated test pattern generation input vectors.

8. The system of claim 1, wherein at least one of the plurality of test points corresponds to a test pin of the memory sub-system controller on the printed circuit board, the test pin comprising a resistor connected in series between a driver and a buffer.

9. The system of claim 8, wherein:
a first test point is placed between the driver and the resistor; and
a second test point is placed between the resistor and the buffer.

10. An in-circuit test device comprising:
a processing device executing instructions that cause the processing device to convert automated test pattern generation input test vectors from a standard test interface language (STIL) file to a set of test signals capable of driving a set of test points of a memory sub-system controller, the set of test signals including a test signal capable of driving a scan-in pin of the memory sub-system controller that is configured to facilitate testing of the memory sub-system controller using Boundary Scan Description Language (BSDL) test vectors; and
a pin driver to apply one of the test signals generated based on the STIL file to a stimulus point corresponding to a scan-in pin of the memory sub-system controller.

11. The in-circuit test device of claim 10, wherein:
the pin driver is a first pin driver; and
the in-circuit test device further comprises:
a plurality of pin drivers to connect to a plurality of test points of the memory sub-system controller on a printed circuit board, wherein a second pin driver in the plurality of pin drivers reads output data output at an observation point corresponding to a scan-out pin of the memory sub-system controller in response to the test signal.

12. The in-circuit test device of claim 11, further comprising:
a comparator to compare the output signals with output test vectors, the output test vectors comprising an expected result of applying the test signals to the memory sub-system controller, the comparator further to provide test result data comprising a result of comparing the output signals to the output test vectors.

13. The in-circuit test device of claim 11, wherein:
the plurality of test points comprises a set of stimulus points and a set of observation points,
the set of test points corresponds to the set of stimulus points,
at least one stimulus point in the set of stimulus points corresponding to the scan-in pin, and
at least one observation point in the set of observations points corresponding to a one scan-out pin.

14. The in-circuit test device of claim 13, wherein:
a first set of pin drivers applies the test signals to the set of stimulus points, the first set of pin drivers including the first pin driver,
the output signals are output at the set of observation points, and
a second set of pin drivers reads the output signals output at the set of observation points, the first set of pin drivers including the first pin driver.

15. The in-circuit test device of claim 10, wherein at least one test point corresponds to a test pin of the memory sub-system controller, the test pin comprising a resistor connected in series between a driver and a buffer.

16. The in-circuit test device of claim 10, wherein:
the STIL file further comprises output test vectors.

17. The in-circuit test device of claim 10, wherein converting the automated test pattern generation input test vectors from the STIL file to test signals comprises generating electrical signals representative of the automated test pattern generation input vectors.

18. A method comprising:
converting, by an in-circuit test device, automated test pattern generation input test vectors in a standard test interface language (STIL) file to a set of test signals capable of driving a first set of test points of a memory sub-system controller, the set of test signals including a first test signal capable of driving a scan-in pin of the memory sub-system controller that facilitates testing of the memory sub-system controller using Boundary Scan Description Language (BSDL) test vectors; and
applying, by the in-circuit test device, the test signals generated based on the STIL file to the first set of test points of the memory sub-system controller, the applying of the test signals including applying the first test signal generated based on the STIL file to a first test point corresponding to the scan-in pin of the memory sub-system controller.

19. The method of claim 18, further comprising:
reading output signals output at a second set of test points of the memory sub-system controller;
comparing the output signals with output test vectors; and
providing test result data comprising a result of comparing the output signals with the output test vectors.

20. The method of claim 18, further comprising:
accessing, at an in-circuit test device, automated test pattern generation test vector data comprising a standard test interface language (STIL) file, the STIL file comprising input test vectors and output test vectors, the output test vectors comprising an expected result of applying the input test vectors to a memory sub-system controller.

* * * * *